(12) United States Patent
Carrillo et al.

(10) Patent No.: US 11,567,389 B2
(45) Date of Patent: Jan. 31, 2023

(54) DISPLAY

(71) Applicant: University of Exeter, Exeter (GB)

(72) Inventors: Santiago Garcia-Cuevas Carrillo, Exeter (GB); Christopher David Wright, Exeter (GB)

(73) Assignee: University of Exeter, Exeter (GB)

( * ) Notice: Subject to any disclaimer, the term of this patent is extended or adjusted under 35 U.S.C. 154(b) by 344 days.

(21) Appl. No.: 16/641,063

(22) PCT Filed: Aug. 24, 2018

(86) PCT No.: PCT/GB2018/052409
§ 371 (c)(1),
(2) Date: Feb. 21, 2020

(87) PCT Pub. No.: WO2019/038559
PCT Pub. Date: Feb. 28, 2019

(65) Prior Publication Data
US 2020/0409228 A1 Dec. 31, 2020

(30) Foreign Application Priority Data

Aug. 24, 2017 (GB) .................................... 1713586

(51) Int. Cl.
*G02F 1/19* (2019.01)
*G02B 5/00* (2006.01)
*G02F 1/01* (2006.01)

(52) U.S. Cl.
CPC ............... *G02F 1/19* (2013.01); *G02B 5/008* (2013.01); *G02F 1/0147* (2013.01);
(Continued)

(58) Field of Classification Search
CPC ............... G02F 1/1365; G02F 2203/34; G02F 2203/15; G02F 2203/10; G02F 1/19; G02F 1/0147; H01L 45/06; G02B 5/00
See application file for complete search history.

(56) References Cited

U.S. PATENT DOCUMENTS

| 4,956,998 A | 9/1990 | Goebel |
| 2012/0268809 A1* | 10/2012 | Guo ........................ G02B 5/201 359/359 |

(Continued)

FOREIGN PATENT DOCUMENTS

| TW | 200905234 A | 2/2009 |
| WO | 1998/033095 | 7/1998 |

(Continued)

*Primary Examiner* — Mariam Qureshi
(74) *Attorney, Agent, or Firm* — DeLio Peterson & Curcio LLC; Brian G. Schlosser

(57) ABSTRACT

A display is described which comprises a plurality of pixels (12), wherein each pixel (12) comprises a plasmonic resonator (26) including first and second metallic material elements (16, 22) and incorporating a layer (18) of a phase change material, the plasmonic resonator (26) being arranged such that in one material state of the phase change material (18) the electric field coupling between the second metallic material element (22) and the phase change material layer (18) is strong and so strong absorption of selected wavelengths of the incident light occurs, whereas in another state of the phase change material (18) the electric field coupling between the metallic material elements (16, 22) and the phase change material layer (18), and between the first and second metallic material elements (16, 22) is weak and so re-radiation of incident light occurs, the pixel (12) being of high reflectance.

9 Claims, 6 Drawing Sheets

(52) U.S. Cl.
CPC ...... *G02F 2203/10* (2013.01); *G02F 2203/15* (2013.01); *G02F 2203/34* (2013.01)

(56) References Cited

U.S. PATENT DOCUMENTS

2014/0070155 A1* 3/2014 Cohen ..................... B32B 38/10
257/E45.002
2020/0201111 A1* 6/2020 Williams ............. G02B 5/1876

FOREIGN PATENT DOCUMENTS

| WO | 2010//013193 | | 2/2010 |
| WO | 2015097468 | A1 | 7/2015 |
| WO | 2020013193 | A1 | 1/2020 |

* cited by examiner

DISPLAY

This invention relates to a display, and in particular to a display capable of displaying colour images and in which the power consumed by the display, in normal use, is relatively low and so the display can be operated in an energy efficient manner.

A number of designs of display device are known, and they have been in use for a number of years. In one relatively power efficient form of display each pixel takes the form of a cell of a phase change material, the state of which can be controlled by appropriate control over the electric current and temperature applied to the material. FIG. 1 illustrates, diagrammatically, such a pixel. In FIG. 1, the pixel takes the form of a layer 1 of phase change material sandwiched between layers 2, 3 of indium tin oxide and carried by a mirror or reflective material element 4. In use, the application of a certain electric field or current to the layer 1 via the layers 2, 3, or heating thereof, may cause the material to adopt an amorphous form or structure, the application of a different electric field or current across the layer 1, or a change in the heating thereof, causing it to adopt a crystalline structure. In one state, the material of the layer 1 has a significantly different complex refractive index to that in the other state. The difference in refractive index impacts upon the reflectance spectrum of the pixel, changing the amount and spectral content of incident light that is reflected from the pixel. The phase change material of the layer 1 is stable when no electric field or current, or thermal heating, is applied, remaining in the selected state until a field, current or thermal heating is applied to cause it to switch to the other stable state. It will be appreciated, therefore, that power is only consumed when the phase change material of the layer 1 is required to change state. Depending upon the application in which the display is used, changes in state may be required only relatively infrequently, and so the power consumption may be relatively low.

As shown in FIG. 1, each pixel is of multi-layered form, and in order produce a colour image output, the dimensions of the pixel, and in particular the thicknesses of the layers 1, 2, 3, may be selected such that the pixel operates as a Fabry-Perot cavity, and resultant interference effects causing the reflected output from the pixel to fall within a selected wavelength band and so to be of a selected colour.

It is thought that, in a colour display using pixels of this type, groups of pixels designed to have red, green and blue outputs will be provided and controlled in such a fashion that addition of the outputs from each pixel will result in the overall output of the group of pixels being of the desired colour.

A display of this general type is described in WO2015/097468.

It is an object of the invention to provide an alternative form of colour display and which makes use of subtractive rather than additive techniques to achieve a desired colour output.

According to the present invention there is provided a display comprising a plurality of pixels, wherein each pixel comprises a plasmonic resonator including first and second metallic material elements and incorporating a layer of a phase change material, the plasmonic resonator being arranged such that in one material state of the phase change material the electric field coupling between the second metallic material element and the phase change material layer is strong and so strong absorption of selected wavelengths of the incident light occurs, whereas in another state of the phase change material the electric field coupling between the metallic material elements, and between the metallic material elements and the phase change material layer, is weak and so re-radiation of incident light occurs, the pixel being of high reflectance.

Where the phase change material layer is in its crystalline phase, it acts optically as if it were a metal, and so strong coupling occurs, the material acting, optically, as a lossy dielectric when in its amorphous phase, and so coupling is weak. The presence of the material acting as a lossy dielectric, in this condition, between the first and second metallic material elements restricts or resists coupling therebetween, the material acting as an absorber.

Preferably, the first layer of metallic material is reflective, and so light not absorbed by the plasmonic resonator will be reflected from the pixel. Appropriate design of the pixel will determine the wavelengths not absorbed. Accordingly, each pixel may, in one mode of operation, appear to have an output of a specific wavelength profile, and in another mode of operation will appear to have a white output. In this regard, the design may include selection of a dielectric material thickness of the plasmonic resonator (including the phase change material layer) and/or selection of a dimension or shape of the second metallic material element.

By grouping together pixels having cyan, magenta and yellow outputs, it will be appreciated that appropriate control of the group of pixels may result in the group having an overall output of a desired colour.

Preferably, located between the second metallic material element, and the layer of the phase change material is a layer of a dielectric material. The dielectric material layer may serve to provide environmental protection to the phase change material, and may also serve as an element by way of which an electric field, electric current or thermal excitation may be applied to the phase change material to control the material state thereof.

Preferably, the second metallic material element takes the form of an element of generally circular cross-sectional shape. It will be appreciated, however, that the use of elements of other shapes are possible without departing from the scope of the invention, and so the invention is not restricted in this regard.

The phase change material may take the form of GeTe or $Ge_2Sb_2Te_5$ (referred to herein as GST). It will be appreciated, however, that other switchable chalcogenide alloy material films or layers may be used without departing from the scope of the invention. Furthermore, phase change materials of non-chalcogenide alloy material form may be used.

Whilst the display of the invention makes use of pixels that, in some respects, are structurally similar to the pixels described in WO2015/097468, it will be appreciated that the manner of operation of the invention and the physical principles upon which the operation of the display of the invention are based are quite different to the arrangement described in that document, and that there are also structural differences between the arrangements.

The invention will further be described, by way of example, with reference to the accompanying drawings, in which.

Figure 1:
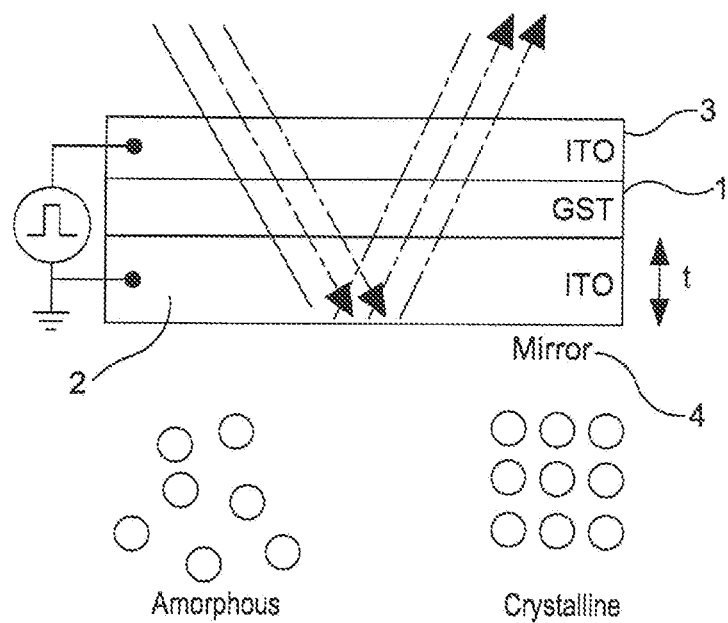
FIG. 1 is a diagrammatic representation of a pixel from a known type of display.
Figure 2:
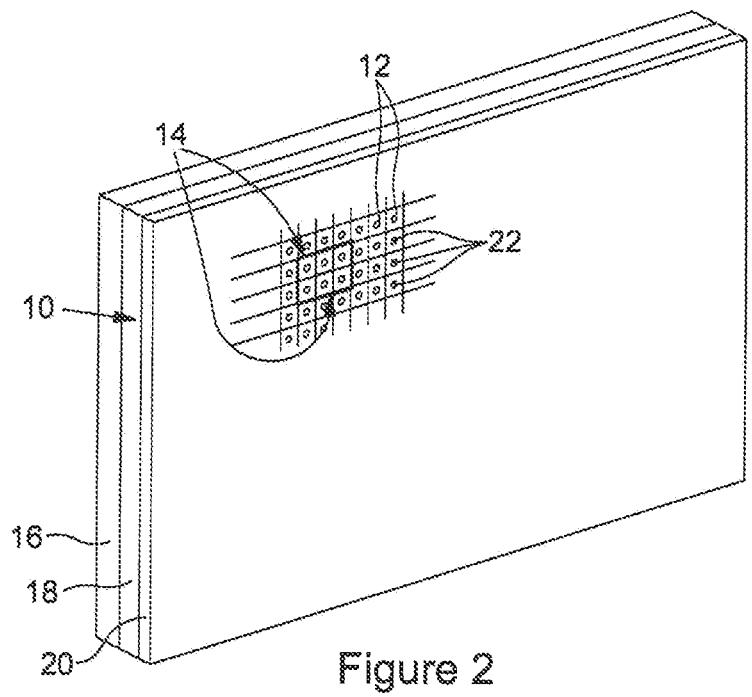
FIG. 2 is a view illustrating a display in accordance with an embodiment of the invention.
Figure 3:
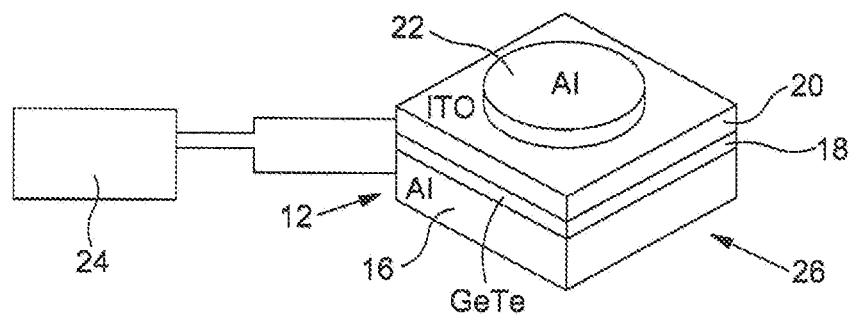
FIG. 3 is a diagrammatic representation illustrating a pixel of the display of FIG. 2.
Figure 4:
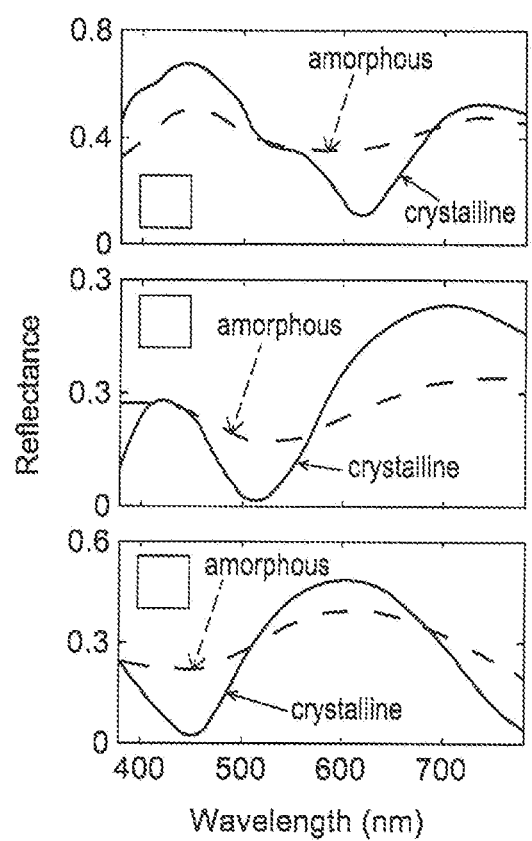
FIG. 4 is a graph illustrating the output of the pixel of FIG. 3.

Referring to FIGS. 2 to 4 of the accompanying drawings, a display 10 is illustrated which includes an array of pixels 12. As described below, certain of the pixels 12 are adapted to output wavelengths giving the pixel a cyan colour appearance, others of the pixels 12 are adapted to have an output giving the pixel a magenta appearance, and still others are adapted to have an output giving the pixel a yellow appearance. The pixels 12 are arranged in groups 14, each group comprising one or more of the cyan pixels 12, one or more of the magenta pixels 12 and one or more of the yellow pixels 12. The pixels 12 are controllable independently of one another, and it will be appreciated that by appropriate control over the operations of the pixels 12, the overall colour output by each group 14 can be controlled.

Turning to FIG. 3, one of the pixels 12 is illustrated in greater detail. The pixel 12 comprises a first metallic layer 16 in the form of an aluminum substrate of relatively great thickness which is common to all of the pixels 12. Located upon the first metallic layer 16 is a layer 18 of a phase change material. In the arrangement shown, the phase change material comprises GeTe, but it will be appreciated that other phase change materials may be used without departing from the scope of the invention.

Located upon the phase change material layer 18 is a layer 20 of a dielectric material, in this case an indium tin oxide (referred to herein as ITO) layer. The ITO layer 20 serves two purposes. Firstly, it acts as an environmental isolation layer, protecting the phase change material layer 18 from oxidation as would tend to occur if the layer 18 were exposed to oxygen in the atmosphere. Secondly, it acts as an electrode by which, in conjunction with the first metallic material layer 16, an electric field, electric current or thermal excitation can be applied across the phase change material layer 16 to permit control over the material state of the phase change material layer 18. The layer 20 is of good optical transparency.

Lastly, located upon the ITO material layer 20 is a second metallic material element 22. In the arrangement shown, the element 22 takes the form of a substantially circular disc of aluminum. As shown in FIG. 2, therefore, the elements 22 of the pixels 12 of the display 10 are arranged in the form of a regular array.

Aluminum is used for the layer 16 and the element 22 due to its good plasmonic behaviour even at visible wavelengths.

Electrical connections can be made to the first metallic material layer 16 and to the ITO layer 20 of each pixel 12, and a controller 24 is used to control the signals applied to each pixel 12 to control the electrical field applied across, and the current flowing through, the layer 18 of each pixel 12. Alternatively, the first metallic material layer 16 or the ITO layer 20 can be used in a micro-heater configuration to thermally excite the phase change material layer 18 of each pixel 12.

In use, the application of a first electric field, current or thermal excitation to the phase change material layer 18 causes the material to adopt an amorphous material state, the application of a second, different electric field, current or thermal excitation causing the phase change material to adopt a crystalline material state. Where no electric field, current or thermal excitation is applied, the material of the phase change material layer 18 remains in its last material state. The material can thus be thought of as bistable.

The combination of the first and second metallic material layers 16, 22 and the dielectric formed by the presence of the ITO layer 20 and the phase change material layer 18 forms a plasmonic resonator structure 26.

Where white light is incident upon the pixel 12, and where the phase change material layer 18 of the pixel is controlled so as to be in its crystalline material state, the incidence of the light on the second metallic material element 22 induces a plasmonic resonance in the element 22, generating an oscillating in-plane dipole which strongly couples to the chalcogenide phase change material layer 18. The presence of the material layer 18 in its crystalline state acts, effectively, as a metallic layer in these circumstances due to its negative (real) electric permittivity at visible wavelengths. This coupling results in the generation of an oscillating magnetic dipole orientated orthogonally to the electric dipoles. The presence of the oscillating electric and magnetic dipoles results in strong absorption of certain wavelengths of the incident light. The pixel thus has an output colour dependent upon which wavelengths are absorbed and which are transmitted.

The wavelengths absorbed by the plasmonic resonator structure 26 depend upon the size of the second metallic material element 22, for example the diameter thereof, and upon the thickness of the combination of the ITO layer 20 and the phase change material layer 18. It is convenient for the phase change material layer 18 to be of uniform thickness, in which case it can comprise a single layer extending over the full display 10, and so the wavelengths absorbed by the structure 26 are conveniently determined by the thickness of the ITO layer 20. Accordingly, the thickness of the ITO layer 20 of certain of the pixels 12 will be such that the pixel output is of cyan appearance, the thickness of the ITO layer 20 of others of the pixels 12 being such that pixel output is of magenta appearance, and the thickness of the ITO layer 20 for others of the pixels 12 being such that the pixel output is of yellow appearance.

Where the phase change material layer 18 of a pixel 12 is controlled so as to be in its amorphous state, then the coupling between the dipole induced in the second metallic material element 22 and the phase change material layer 18 is only weak, as is any coupling between the second metallic material element 22 and the first metallic material layer 16. As a consequence the oscillating magnetic dipole is not generated or is much weaker. The relatively weak coupling arises as a result of the material of the phase change material layer 18 acting effectively as a lossy dielectric in this state. Under these conditions, the electric dipoles induced in the second metallic material element 22 re-radiate the incoming light, and so the pixel 12 will be highly reflective and so will have a bright white appearance.

In the arrangement shown, the thickness of the layer 16 is about 80 nm, chosen to be great enough to prevent radiation from passing through the structure. The thickness of the layer 18 is about 30 nm, chosen to be thin enough to facilitate switching between states, whilst thick enough to achieve a good optical contrast between its two different states, in use. The element 22 is of thickness in the region of 30 nm to prevent significant deviation of the optical constants thereof from those of the bulk while at the same time being thin enough to provide with a good lithographic process facilitating lift-off.

In use, at resonance, a gap plasmon is excited in the structure and currents in the top metal resonator (element 22) are mirrored in the bottom metal plane (layer 16), resulting in the excitation of a transversal magnetic resonant mode. This mode is, in this case, essentially a magnetic dipole below the top resonator and transversal to the polarization direction of the incident electric field. Ideally, if the structure is properly designed, the incident radiation can be perfectly coupled to the resonant mode, resulting in near-zero reflectance at the resonant wavelength/frequency, which is here is chosen to coincide with the centre of the RGB wavebands, so generating, at resonance, CMY pixels. Whilst the ideal situation is that perfect coupling is achieved, some deviation from this may be acceptable depending upon the application in which the invention is employed.

The process for designing the different pixels starts with a parametrization of the geometric distances that mainly determine the performance of the device, i.e. the thickness of the ITO layer 20 ($t_{ito}$), the width (diameter) of the top metallic resonator 22 ($W_p$) and the width ($W_{uc}$) of the unit cell (i.e. the periodicity of the structure). The reflectance spectra of the designed structures are then calculated at visible wavelengths using finite element modelling (FEM). Once an appropriate reflectance spectrum is achieved, colorimetric calculations are carried out to quantify the performance of the device in terms of colour production. Once a geometrical representation, as points on the standard CIE 1931 chromaticity diagram, of the reflectance spectra of the pixel (with the GeTe layer both crystalline and amorphous) has been produced, a further optimization algorithm is run on the structure that minimizes the distance between of these points and those for 'ideal' CMY pixels (the latter chosen according to the "Specifications for Web Offset Publications". A pattern search algorithm, in the Global Optimization Toolbox in Matlab®, may be used to find the optimum geometry that makes the points corresponding to the calculated spectra to be as close as possible to their respective chosen objectives.

Figure 5:
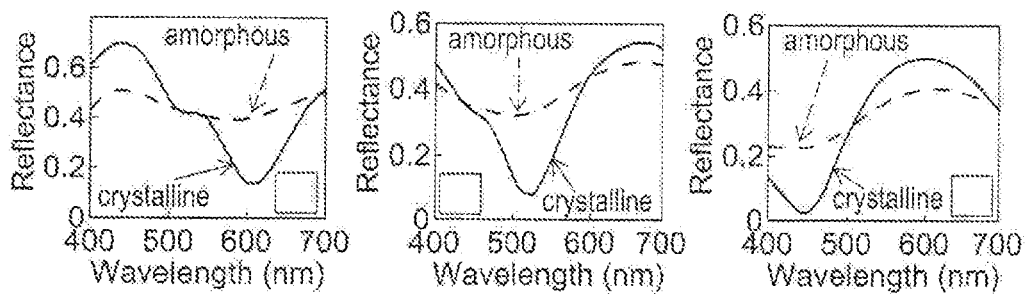
FIG. 5 illustrates optimized reflectance spectra obtained by FEM simulation.

Following the above approach, the calculated reflectance spectra corresponding to the optimal phase-change absorber structure for cyan, magenta and yellow pixels are shown in FIG. 5. It can be seen, that these reflectances are indeed characterized by a strong absorption in the red, green and blue when the GeTe layer is crystalline, and a nearly flat response when the GeTe layer is amorphous. The resonant behaviour and the subsequent absorption (with the GeTe in the crystalline state) result from a better confinement of the resonant mode in the ITO layer. This can be seen in FIG. 6 where the distribution of the amplitude of the magnetic field (perpendicular to the plane of the paper) is shown for the magenta pixel at 520 nm excitation wavelength and with the GeTe layer crystalline and amorphous. The field amplitudes are much higher when GeTe is crystalline, and the effective confinement of the field to the ITO layer is clear. This is precisely what would be expected for the reasons set out above relating to the operation of the structure and the optical constants of GeTe.

Figure 6:
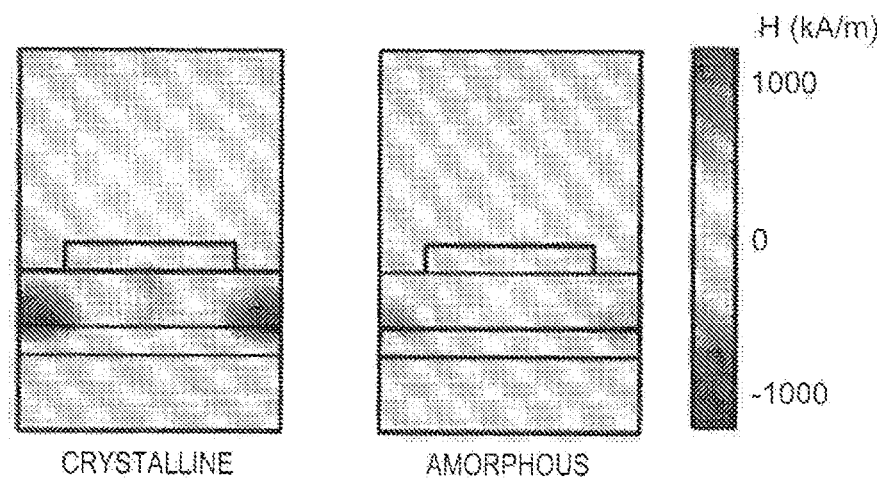
FIG. 6 illustrates the magnetic field distribution in the pixel in its two operating conditions.

The structural dimensions yielding the CMY responses shown in FIGS. 5 and 6 are set out below:

TABLE 1

Geometrical parameters for the optimized phase-change MIM type cyan, magenta and yellow pixels (all dimensions in nm).

| Pixel type | $w_{uc}$ | $w_p$ | $t_{ito}$ |
|---|---|---|---|
| Cyan | 329 | 214 | 84 |
| Magenta | 278 | 181 | 60 |
| Yellow | 240 | 156 | 37 |

FIG. 4 illustrates, for the three different colour pixels 12, the reflectance of the pixel 12 to light of different wavelengths, the solid lines illustrating the reflectance when the phase change material layer 18 is in its crystalline phase and the broken line illustrating the reflectance when the phase change material layer 18 is in its amorphous phase. It is clear from FIG. 4 that when the material of the layer 18 is in its amorphous phase the pixel 12 is of good reflectivity across all wavelengths, whereas when it is in its crystalline phase the reflectivity is more frequency selective giving rise to the respective coloured outputs from the pixels.

As mentioned hereinbefore, the pixels 12 are arranged in groups 14, each of the groups 14 including pixels 12 of each of the three different types. By appropriate control over the operation of each pixel 12 in the group 14, the overall output of the group 14 can be controlled to be of a selected colour by subtracting from the incident white light the colours that are not required. The invention has the advantages that a colour display of good brightness and fast response can be achieved. As electrical power is only consumed when the electric field, current or thermal excitation is applied to switch the material of the layer 18 of each pixel 12 from one material state to the other, it will be appreciated that by appropriate control over the display 10 the power requirements of the display 10 can be relatively low.

Whilst the display may be embodied as a television display, computer monitor, mobile telephone screen or the like, the invention also has application in wearable devices such as smartphones, signage, in security identifier applications and in e-paper and the like.

EXAMPLES

Figure 7A:
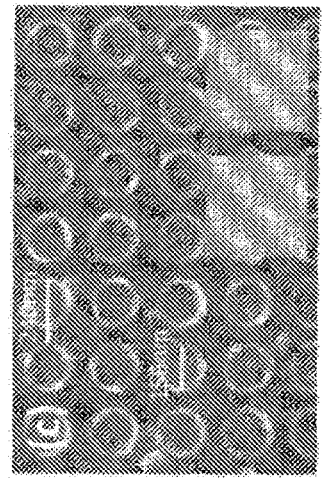
FIG. 7 illustrates example embodiments and their characteristics.
Figure 7B:
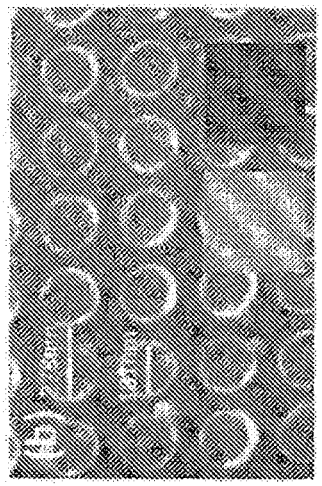
Figure 7C:
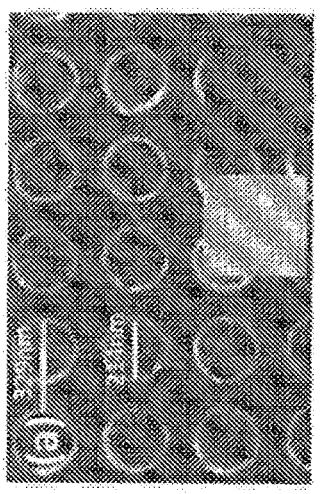

Pixels of each colour were fabricated using magnetron sputtering to deposit the stack of layers (i.e. the Al, GeTe and ITO layers) on a Si/SiO$_2$ substrate, followed by electron-beam lithography to define the top resonator pattern (carried out using a PMMA mask followed by sputter deposition of the top Al layer and lift-off. Scanning electron microscope (SEM) images of the as-fabricated structures are shown for each pixel colour in FIGS. 7a, 7b and 7c along with, inset, the actual colours generated by the experimental pixels with the GeTe layer in the amorphous and crystalline phases. FIGS. 7a-c reveal that the target dimensions of the top resonator pattern (as in Table 1) match very closely those actually achieved. Moreover, with GeTe in the crystalline phase the desired CMY colours are produced and, with the GeTe amorphous, a more white-like response is obtained. A more quantitative evaluation of the colours produced can however by obtained by measurement of the reflectance spectra and by mapping to the standard CIE colour diagram, both of which we described below.

Figure 7D:
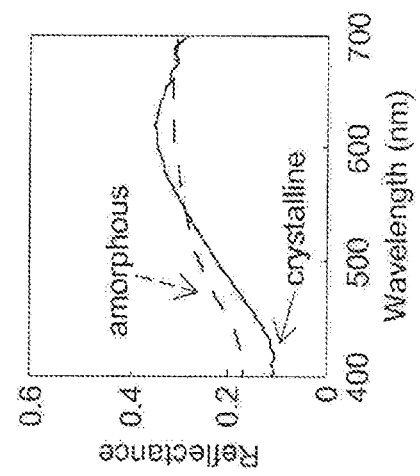
Figure 7E:
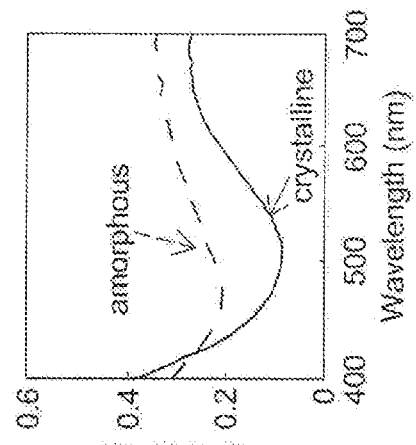
Figure 7F:
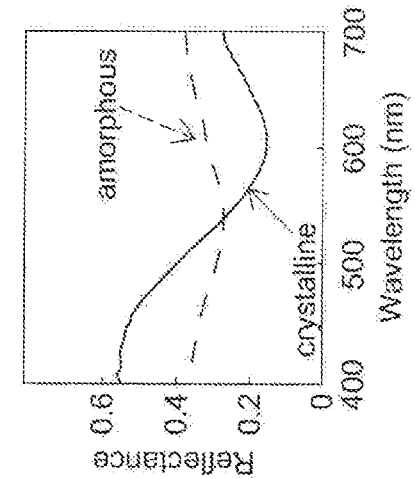
Figure 7G:
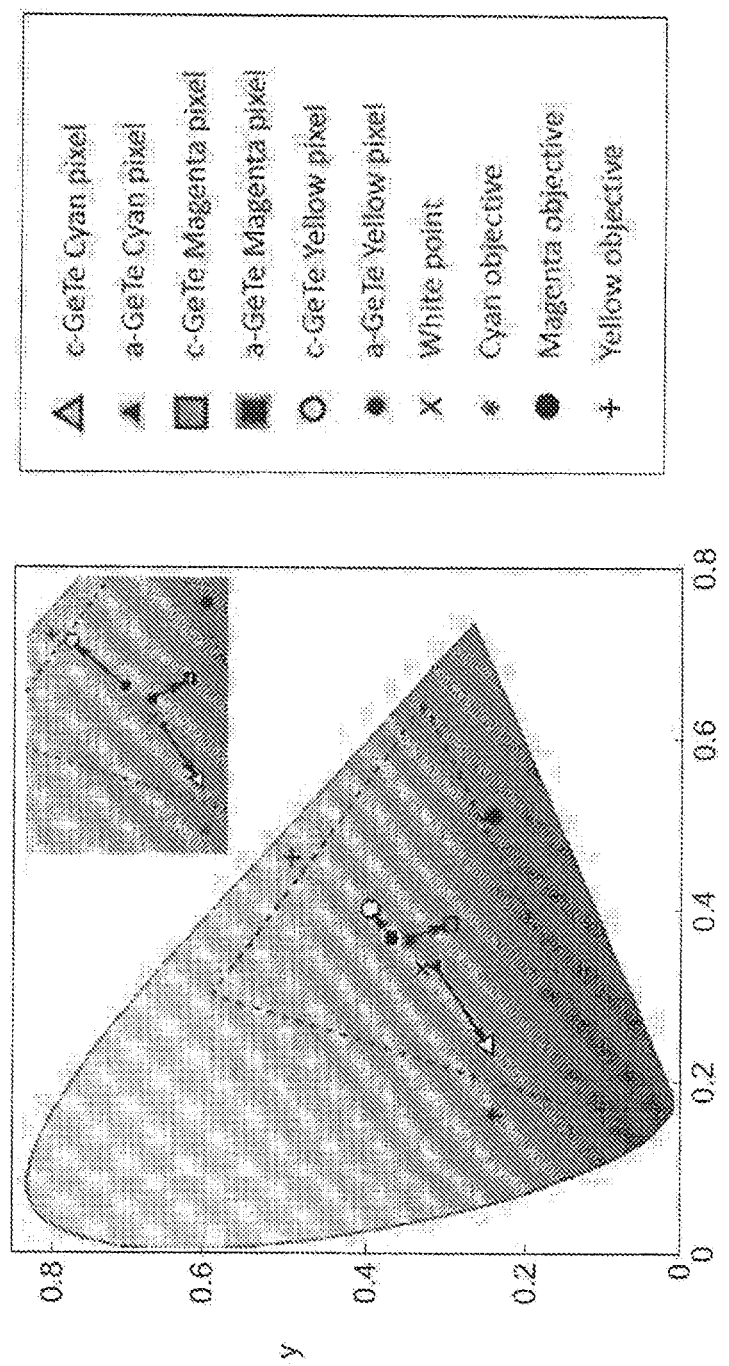

The reflectance spectra of the as-fabricated phase-change MIM structures were measured using a Jasco MSV-5300 UV-Visible/NIR Microspectrometer. Once the data corresponding to the as-deposited amorphous phase of the GeTe had been obtained, crystallization of the GeTe was undertaken by heating to 250° C. for 15 minutes and re-measured the spectra. The results are shown in FIGS. 7d, 7e and 7f and show the expected preferential absorption (with GeTe crystalline) in the RGB wavebands for the CMY pixels respectively. These measured spectra were then mapped to the CIE 1931 chromaticity diagram, as shown in FIG. 7g (where, for comparison purposes, also shown, inset, is the mapping of the colours simulated via FEM). A good performance for the experimental cyan and magenta pixels when compared with the simulated behaviour can be observed. However, when the MIM absorption peak moves to blue wavelengths (~420 nm), so producing a yellow colour, the agreement between the experimental and simulated pixels is not so strong. This is most likely due to the fact that the blue MIM absorber has the smallest feature sizes and so imperfections in the fabrication process (e.g. film roughness) have a greater influence on performance. Such imperfections, as well as uncertainties in the optical constants of the various layers use in the devices, are most likely the cause of differences seen in the simulated and experimental reflectance spectra. A closer correlation between the simulated (i.e. designed) performance and that achieved experimentally is thus expected for tightly-characterized films and optimized deposition conditions (e.g. to reduce roughness).

Turning to the generation of display information and images using the phase-change MIM pixels designed and fabricated above, for fixed displays, such as permanent or semi-permanent signage/advertising/notifications, the vivid colour differences obtained using the CMY pixels (i.e. with the GeTe layer fixed in the crystalline state) could be used to very good effect. By way of example a simple warning display may be generated using combinations of cyan/magenta pixels and cyan/yellow pixels. The advantage of using the phase-change MIM approach for such fixed displays is that the colour is essentially structurally generated and so, unlike ink-based displays, is not subject to any fading with age or extended exposure to sunlight. Moreover, the stronger the ambient illumination, the stronger the resulting image contrast, unlike the case for many conventional electronic displays. Of course, since the GeTe layer can be switched between phases, by for example using electrical or thermal excitation, we are not limited to the generation of fixed displays.

Figure 8D:
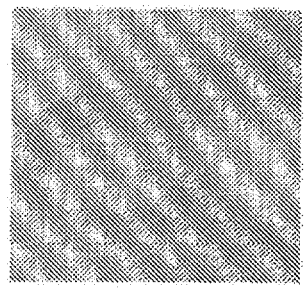
FIG. 8 illustrates example displays.
Figure 8C:
Figure 8B:
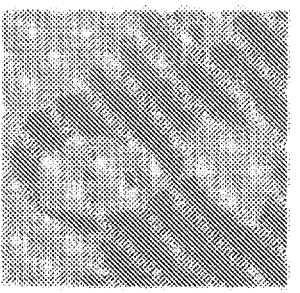
Figure 8A:

A phase-change MIM type pixel based display can be used to display more complex image information. By way of example, FIG. 8a shows a binary (black and white) image of the Mona Lisa, rendered in FIG. 8b into a binary image in a phase-change MIM display, here using magenta pixels with the GeTe layer in either crystalline or amorphous states. In FIG. 8c we show an 8-level grey-scale version of the Mona Lisa, rendered in FIG. 8d to an 8-level image in the phase-change MIM display, again in this case using magenta pixels. Note that the 8-levels of contrast are here attained by assuming that the GeTe layer can be switched into 8 different fractionally-crystallized states; since chalcogenide phase-change memories have been shown capable of being switched to multiple levels, such an assumption is reasonable. Such a grey-scale display could find utility in emerging applications such as wearable electronics, where there is a need to display basic information in a cheap and simple way and under a wide variety of ambient light conditions. However, it should be noted that, as demonstrated via the colour map of FIG. 7g, our phase-change MIM displays are not limited to simple binary or grey-scale colour generation. Indeed, pixels could be combined in various arrangements to form new palettes richer in colour.

As pointed out hereinbefore, the devices have the ability to modulate light absorption in the red, green and blue spectral bands. This type of behaviour is intimately related to human visual perception, specifically with the cone cells located in the retina and responsible for colour perception. Thus, it may well be that devices of the type presented here can offer new and interesting possibilities in biologically-inspired artificial vision systems or visual prostheses.

In summary, we have demonstrated how it is possible, as a result of the combination of chalcogenide phase-change materials and metamaterial absorber structures, to create a novel tunable subtractive CMY-based optoelectronic colour generation system. Our approach has the advantages of being non-volatile, fast, inexpensive and suitable for use in a wide range of ambient light conditions, including bright sunlight. There are thus many attractive potential applications for such displays, including mobiles, smart labelling, in-window displays, IoT devices, wearables, near-eye displays and even, possibly, artificial retinas.

Although the description hereinbefore is of a specific embodiment of the invention, it will be understood that a number of modifications and alterations may be made thereto without departing from the scope of the invention. By way of example, the materials of the metallic layers and elements 16, 22 may be changed, and the shapes of the second metallic material elements 22 may be of other forms. The second metallic material elements 22 may be formed by lithographic patterning, but it will be appreciated that other techniques may be used if desired. Other phase change materials may be used instead of the GeTe or GST material mentioned hereinbefore, and other materials may be used instead of ITO for the layer 20. It will be appreciated, however, that the material used in the layer 20 should be of transparent form.

The above mentioned alternatives do not represent an exhaustive list of the changes that may be made without departing from the scope of the invention.

The invention claimed is:

1. A display comprising a plurality of pixels, wherein each pixel comprises a plasmonic resonator including first and second metallic material elements and incorporating a layer of a phase change material, wherein the phase change material is a chalcogenide, and further comprising a layer of dielectric material located between the second metallic material element and the layer of the phase change material, the plasmonic resonator being arranged such that in one material state of the phase change material the electric field coupling between the second metallic material element and the phase change material layer is strong and so strong absorption of selected wavelengths of incident light occurs, whereas in another state of the phase change material the electric field coupling between the first or second metallic material elements and the phase change material layer is weak and re-radiate incident light, the pixel being of high reflectance.

2. The display according to claim 1, wherein the first metallic material element is reflective, and so light not absorbed by the plasmonic resonator will be reflected from the pixel.

3. The display according to claim 1, wherein at least some of the pixels have different plasmonic resonator dielectric material thicknesses (including the phase change material layer) and/or different dimensions and/or shapes for the second metallic material element.

4. The display according to claim 1, wherein the pixels are arranged in groups, each group including at least one pixel having a cyan output, at least one pixel having a magenta output and at least one pixel having a yellow output.

5. The display according to claim 1, further comprising a controller controlling operation of each of the pixels.

6. The display according to claim 1, wherein the dielectric material layer serves to provide environmental protection to the phase change material, and additionally serves as an element by way of which an electric field may be applied to the phase change material to control the material state thereof.

7. The display according to claim 1, wherein the dielectric material is optically transparent.

8. The display according to claim 1, wherein the second metallic material element takes the form of an element of generally circular cross-sectional shape.

9. The display according to claim 1, wherein the phase change material takes the form of GeTe or $Ge_2Sb_2Te_5$.

* * * * *